(12) United States Patent
Imada et al.

(10) Patent No.: US 7,577,560 B2
(45) Date of Patent: Aug. 18, 2009

(54) MICROCOMPUTER LOGIC DEVELOPMENT DEVICE

(75) Inventors: Shougo Imada, Kobe (JP); Kouichi Kanou, Kobe (JP); Takashi Higuchi, Kobe (JP)

(73) Assignee: Fujitsu Ten Limited, Kobe-shi (JP)

( * ) Notice: Subject to any disclaimer, the term of this patent is extended or adjusted under 35 U.S.C. 154(b) by 345 days.

(21) Appl. No.: 10/884,636

(22) Filed: Jul. 2, 2004

(65) Prior Publication Data

US 2005/0039149 A1  Feb. 17, 2005

(30) Foreign Application Priority Data

Jul. 4, 2003  (JP)  ............... 2003-191940

(51) Int. Cl.
G06F 9/455  (2006.01)
G06F 11/00  (2006.01)

(52) U.S. Cl. ............... 703/24; 703/21; 703/27; 703/28; 714/28; 714/29; 714/30; 714/31; 714/39; 701/29; 701/33; 701/35

(58) Field of Classification Search ............... None
See application file for complete search history.

(56) References Cited

U.S. PATENT DOCUMENTS

| | | | |
|---|---|---|---|
| 4,322,812 A * | 3/1982 | Davis et al. ............... 711/109 |
| 6,226,713 B1 * | 5/2001 | Mehrotra ............... 711/118 |
| 6,263,305 B1 * | 7/2001 | Yamaga ............... 703/25 |
| 6,360,194 B1 * | 3/2002 | Egolf ............... 703/26 |
| 2004/0031003 A1 * | 2/2004 | Hiquchi et al. ............... 716/7 |
| 2004/0083234 A1 | 4/2004 | Higuchi |

FOREIGN PATENT DOCUMENTS

| | | |
|---|---|---|
| JP | 06-169384 | 6/1994 |
| JP | 8185335 | 7/1996 |
| JP | 2001-24827 | 1/2001 |
| JP | 2003-167756 | 6/2003 |
| JP | 2003167756 | 6/2003 |
| JP | 2003-280902 | 10/2003 |
| JP | 2004-013626 | 1/2004 |

* cited by examiner

Primary Examiner—Hyung S Sough
Assistant Examiner—Kaushikkumar Patel
(74) Attorney, Agent, or Firm—Fogg & Powers LLC

(57) ABSTRACT

A microcomputer logic development device realizing high speed sampling RAM monitoring by connecting an existing RAM measurement device, provided with a first block providing functions corresponding to a microcomputer core, a second block having functions corresponding to microcomputer resources, a bus connecting the first and second blocks, and a RAM measurement block provided with a common memory, connected with the bus and RAM measurement device, and realizing a RAM monitor function with respect to the first block, the RAM measurement block realizing a high speed RAM monitoring operation by dividing the timing for processing between the first block and common memory and the timing for processing between the common memory and RAM measurement device.

12 Claims, 10 Drawing Sheets

Fig.5

RAM MONITOR ADDRESS TABLE 19

| No | ADDRESS (2 BYTE) TABLE COUNTER (NUMBER OF USAGES) | DATA (4 BYTE) |
|---|---|---|
| - | | - |
| 0 | **********00 | ******************** |
| 1 | **********00 | ******************** |
| 2 | **********00 | ******************** |
| 3 | **********00 | ******************** |
| 4 | **********00 | ******************** |
| 5 | | |
| ...... | ...... | ...... |
| 125 | | |

RAM MEASUREMENT BOARD 13
RAM MONITOR PROCESSING CONTENT

MOTHER BOARD 2
RAM MONITOR PROCESSING CONTENT

Fig. 9

RAM WRITE ADDRESS TABLE 21

| WRITE ADDRESS(2 BYTE) | DATA SIZE | WRITE DATA(4 BYTE) |
|---|---|---|
| ************ | 1/2/4 | ************************ |

RAM MEASUREMENT BOARD 13
WRITE PROCESSING CONTENT

MOTHER BOARD 2
WRITE PROCESSING CONTENT

MICROCOMPUTER LOGIC DEVELOPMENT DEVICE

This application claims priority to Japanese Patent Application No. JP-2003-191940 filed on Jul. 4, 2003.

BACKGROUND OF THE INVENTION

1. Field of the Invention

The present invention relates to a microcomputer logic development device used when developing a built-in microcomputer, more particularly relates to a microcomputer logic development device adding a RAM monitor function.

2. Description of the Related Art

Electronic control units (ECU) for engine control and other electronic control devices have to be improved in performance along with enactment of tougher emission controls and other legal regulations and improvements in microcomputer performance. Therefore, electronic control devices have to be improved every year. New applications are being developed in advance of current levels of electronic control device performance (hereinafter called "advance logic").

Such advance logic is often developed targeting the next generation of microcomputers offering improved performance over the present. However, at the time of development of advance logic, there are no actual electronic control devices with the next generation microcomputers built in them.

The inventors previously proposed a microcomputer logic development device able to provide the processing performance required for processing advance logic for CPU functions and able to provide resources matching the advanced device from peripheral resources of the microcomputer (for example, see Japanese Unexamined Patent Publication (Kokai) No. 2003-167756 and Japanese Unexamined Patent Publication (Kokai) No. 2004-013626).

With this microcomputer logic development device, it becomes possible to develop a built-in microcomputer able to realize advanced logic in a short time. At the same time, the microcomputer logic development device can be repeatedly utilized.

FIG. 1 will be used to explain the configuration of a conventional microcomputer logic development device. Note that FIG. 1 shows an embodiment of the present invention. Therefore, it should be understood that FIG. 1 includes parts of a configuration not existing in a conventional device.

The microcomputer logic development device 1 is comprised of a mother board 2 realizing functions corresponding to a microcomputer core, a core board 3 realizing functions corresponding to microcomputer resources, and an interface board 4 realizing functions corresponding to ECU hardware.

The mother board 2 and core board 3 are connected by a PCI bus 12 and communicate data of I/O information. The mother board 2 and core board 3 have I/O driver software 6 and 7 loaded in them and control communication of data of the I/O information.

Next, one of the peripheral functions of a microcomputer is the RAM monitor function. This is a function for extracting RAM data of an address of the microcomputer and returning it to an externally connected RAM measurement device when an address is designated from the RAM measurement device.

FIG. 2 shows the configuration of a RAM monitor in a built-in microcomputer of an ordinary ECU.

In an ECU built-in microcomputer 24, the CPU 25 is connected with the RAM 27 and ROM 28 through an internal bus 26. The internal bus 26 is connected through a direct memory access (DMA) 29 to the RAM monitor function 30.

The RAM measurement device 14 is connected to a RAM monitor function 30. The RAM measurement device 14 is known, designates RAM addresses and sends them to the monitor function 30, and stores the RAM data returned from the monitor function 30. The stored data is displayed processed to a suitable display format.

The RAM monitor function 30 has a non-brake debugging (NBD) function. The RAM monitor function 30 is one of the on-chip debugging functions. It sets the sampling time in accordance with a specific communication protocol and, when requesting an address of the memory to be monitored, operates the DMA 29 and extracts and returns the data of the requested address.

The DMA 29 is a function enabling the memory 1 to be directly read and written without software processing. Therefore, in the illustrated built-in microcomputer 24, it is possible to monitor the RAM without stopping software in the middle of processing. Further, the DMA 29 is a hardware structure, so can perform processing at a high speed.

When the RAM measurement device 14 is applied to the microcomputer logic development device 1 shown in FIG. 1, it is necessary to realize the part of the RAM monitor function 30 by a core board separate from the mother board. In this case, the processing when receiving a request for an address from the RAM measurement device 14 until extracting and returning data through the PCI bus is executed by software processing, so high speed response is impossible like in the conventional device shown in FIG. 2.

SUMMARY OF THE INVENTION

An object of the present invention is to provide a microcomputer logic development device which realizes a high speed sampling RAM monitor by connecting an existing RAM measurement device.

The control software in the microcomputer logic development device is an event driven type executing processing in accordance with outside events. A processing unit is defined by processing when begins and ends when any event is received. Therefore, the RAM values of the control software are updated for each processing unit. Accordingly, if monitoring by processing units of the control software, it becomes possible to monitor the latest values of the RAM values without loss. On the other hand, it is necessary to send the results for a request from the RAM measurement device within the time defined in the RAM measurement device.

Therefore, the present invention provides a RAM measurement device comprised of a first block providing functions corresponding to a microcomputer core, a second block providing functions corresponding to microcomputer resources, a bus connecting the first and second blocks, and a RAM measurement block including a common memory and connecting the first block with a RAM measurement device. The processing for monitoring the RAM of the first block by the RAM measurement device is divided into processing for writing content of the RAM in the common memory and processing for sending content of the common memory to the RAM measurement device, and separating the processing timings. Due to this, an overall high speed, high performance RAM monitor function is realized.

According to the present invention, it is possible to provide a microcomputer logic development device realizing high speed sampling RAM monitoring by connecting an existing RAM measurement device. Due to this, it is possible to improve the logic development environment. Further, it is possible to utilizing existing devices as they are and to reduce costs.

BRIEF DESCRIPTION OF THE DRAWINGS

These and other objects and features of the present invention will become clearer from the following description of the preferred embodiments given with reference to the attached drawings, wherein:

FIG. 5 is a view of the structure of the address table for a RAM monitor operation stored in the common memory of FIG. 1;

FIG. 9 is a view of the structure of the address table for a RAM write operation stored in the common memory of FIG. 1;

DESCRIPTION OF THE PREFERRED EMBODIMENTS

Preferred embodiments of the microcomputer logic development device to which the present invention is applied will be described in detail below while referring to the attached figures.

Figure 1:
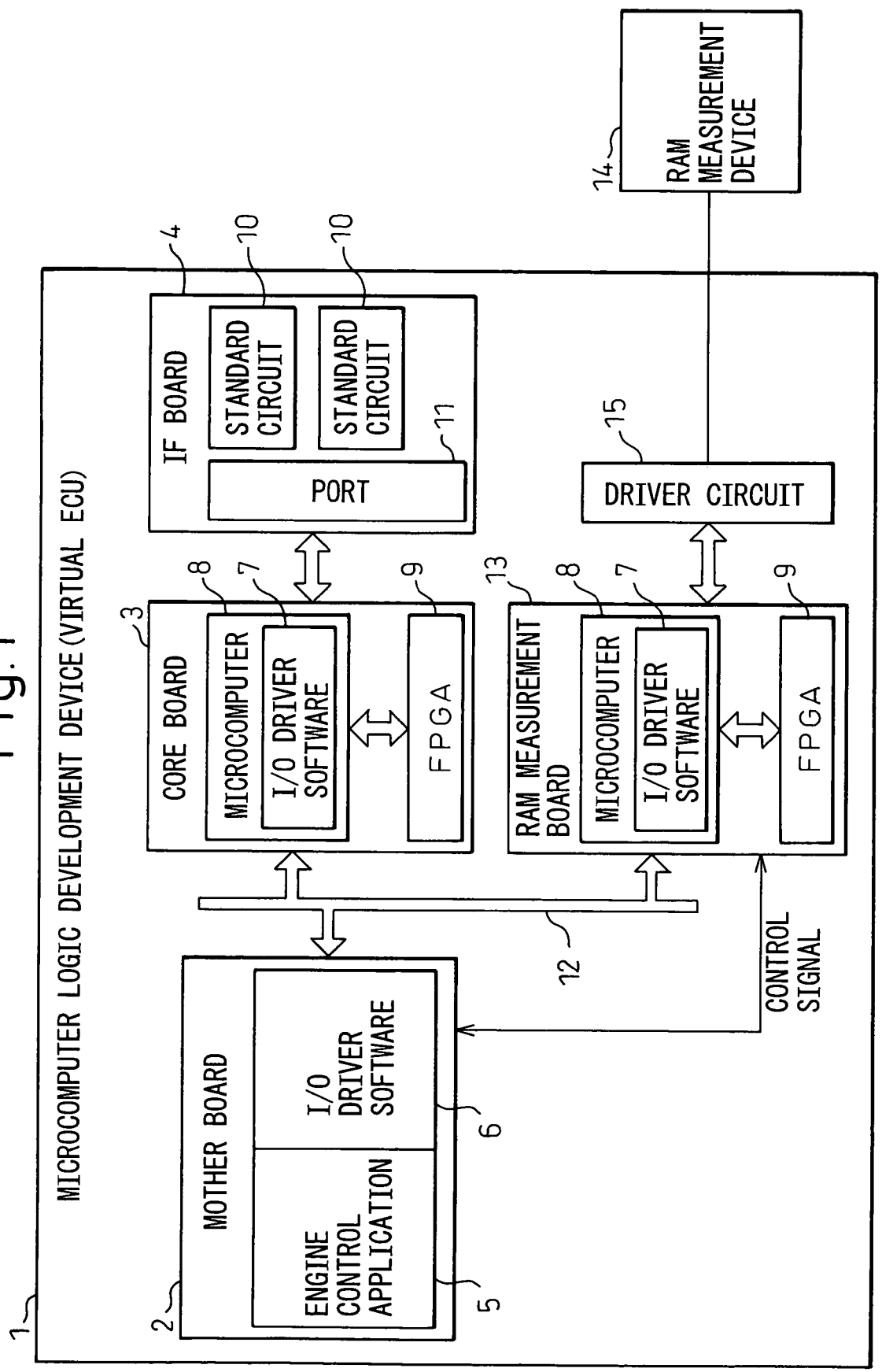
FIG. 1 is a view of the configuration of a microcomputer logic development device to which the present invention is applied.
Figure 2:
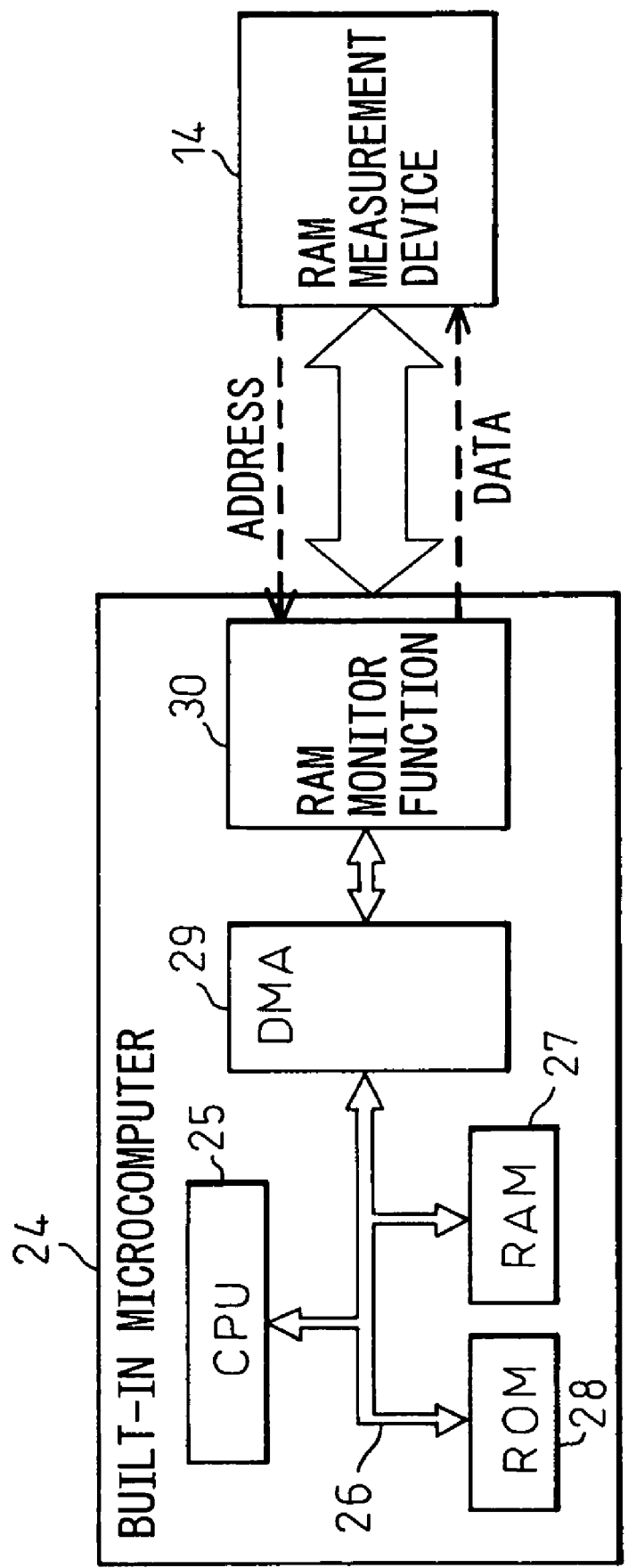
FIG. 2 is a view of the configuration for RAM monitoring in a conventional built-in microcomputer.

FIG. 1 shows the configuration of a microcomputer logic development device 1 which realizes a virtual ECU.

The microcomputer logic development device 1 is comprised of three boards, that is, a mother board 2 for realizing functions corresponding to a microcomputer, a core board 3 for realizing functions corresponding to microcomputer resources, and an interface board for realizing functions corresponding to ECU hardware. Their configurations are similar to those described in the above patent publications.

As the processing device built in the mother board 2, a general use CPU is used. This CPU processing performance is set with several levels better processing performance than that actually used for the built-in microcomputer. The microcomputer is loaded with an engine control application 5 and I/O drive software 6.

The core board 3 mounts a microcomputer 8 loaded with I/O drive software 7 and a microcomputer peripheral unit (FPGA).

The interface board 4 mounts a plurality of standard circuits 10 and is connected to the core board 3 through a port assignment conversion port 11.

The mother board 2 and the core board 3 are connected by a PCI bus 12 and control data communication of the I/O information by I/O drive software 6.

The microcomputer does not mount I/O functions, but the built-in microcomputer requires a core and resources as the I/O functions. To obtain the equivalent, the core board 3 and the PCI bus 12 are combined to realize equivalent functions.

In this example, to realize a RAM monitor, a RAM measurement board 13 is added to the microcomputer logic development device 1 and thereby enable connection with an existing RAM measurement device 14.

The RAM measurement board 13 realizes the RAM monitor function part by a configuration similar to the core board 3. The RAM measurement board 13 is connected to the PCI bus 12 and is connected through the driver circuit 15 to the RAM measurement device 14.

The RAM monitor function of the RAM measurement board 13 extracts the RAM data of the address designated from the RAM measurement device 14 and returns it to the RAM measurement device 14.

The functions of the RAM measurement device 14 include a RAM monitor function and a RAM write function. The RAM monitor function reads out the designated address from the RAM measurement device 14 and returns the data value. The RAM write function writes the designated data at the designated address by the RAM measurement device 14.

The functions constitute independent processing, so will be explained separately below.

(RAM Monitor Function)

Figure 3:
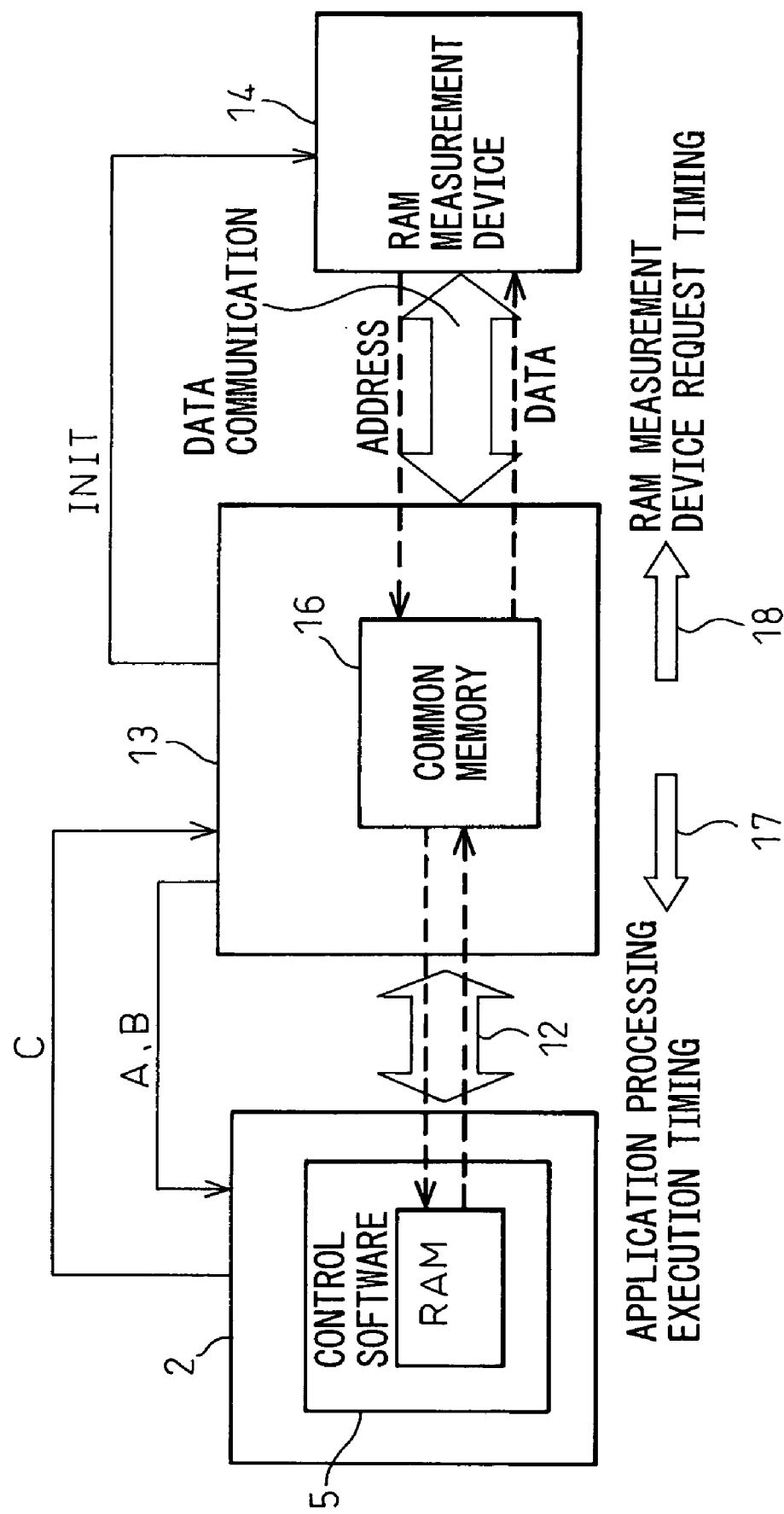
FIG. 3 is a view of the processing timing by a RAM measurement board of FIG. 1.
Figure 4:
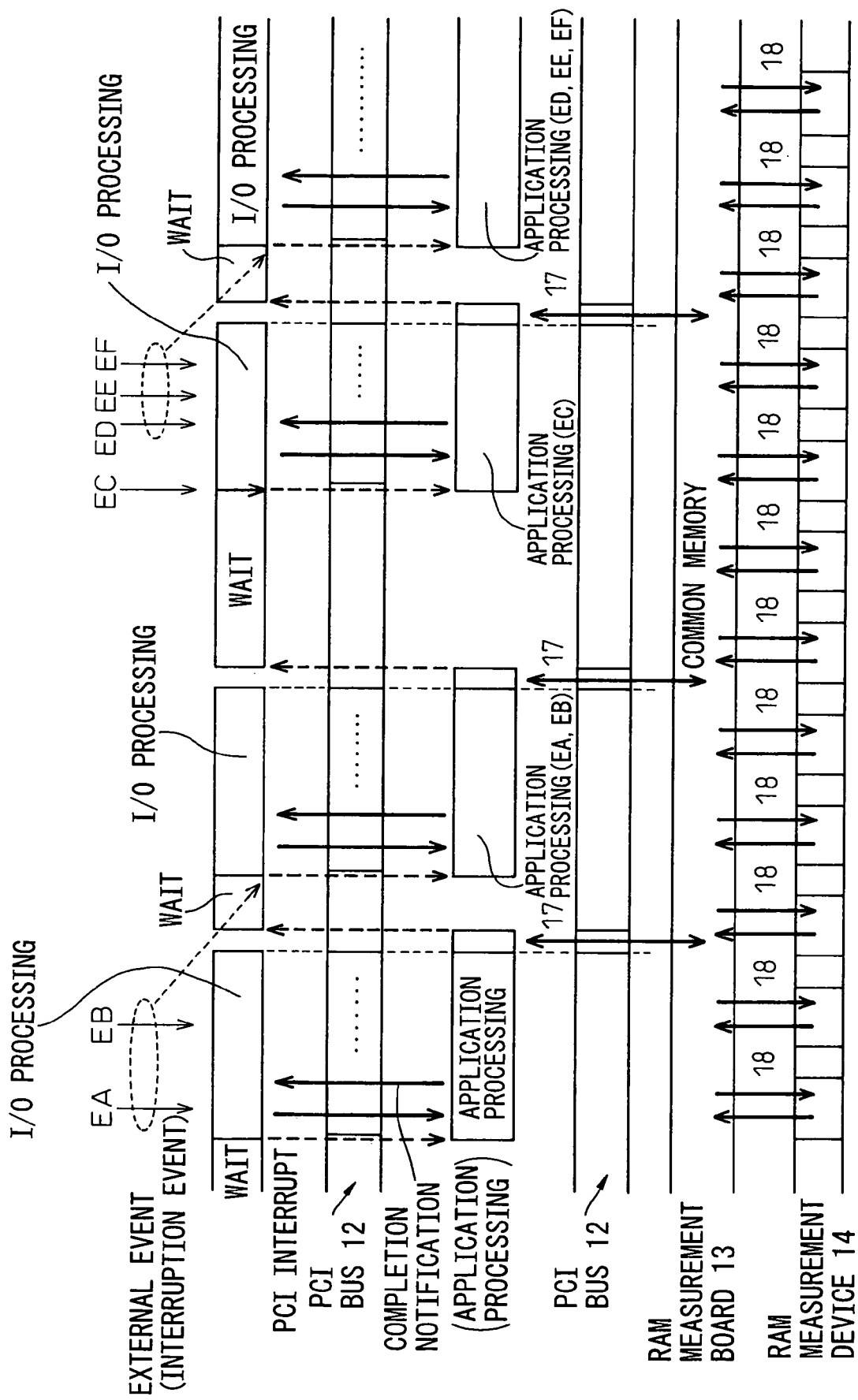
FIG. 4 is a view of the concept of the operation of the RAM measurement operation of FIG. 1.

FIG. 3 and FIG. 4 will be used to explain the RAM monitor operation of the RAM measurement board 13 of FIG. 1.

FIG. 3 shows the timing of processing by the RAM measurement board 13. FIG. 4 shows the content of the processing.

As shown in FIG. 3, the mother board 2 and the RAM measurement board 13 are connected by the PCI bus 12 and communicate data of the I/O information.

The RAM measurement board 13 is provided with a common memory 16. The mother board 2 and the common memory 16 perform update processing at timing 17 of processing units of the control application. The common memory 16 and RAM measurement device 14 communicate data at timing 18 requested from the RAM measurement device 14.

The RAM measurement board 13 outputs an INIT signal to the RAM measurement device 14. The RAM measurement board 13 outputs control signals A and B to the mother board 2. The mother board 2 outputs a control signal C to the RAM measurement board 13. Details of the INIT signal and control signals A and B will be explained later.

The engine control application in the mother board 2 is an event driven type executing software processing in accordance with external events.

As shown in FIG. 4, when receiving events EA and EB at a timing during application processing, the processing is started at the next application processing timing. The processing from the start to the end becomes a processing unit. When receiving an event EC in the standby state, the processing is immediately started. Further, when receiving events EE, EF, and EG at the timing of processing of the event EC, the processing is started at the next application processing timing.

The RAM values of the control application are updated every processing unit. The RAM measurement board 13 receives data at the final timing 17 of the application processing and stores the RAM values read from the mother board 2 in the common memory 16. The content of the RAM stored in the common memory 16 does not change during the data reception timing 17 between the mother board 2 and RAM measurement board 13.

During this time, the common memory 16 and the RAM measurement board 14 perform processing for data communication at the timing 18 defined by the RAM measurement device 14.

The latest values of the RAM values can be monitored without loss by executing the RAM monitor operation in processing units of the control application.

FIG. 5 shows the structure of the RAM monitor address table.

The common memory 16 stores the address table 19. The address table 19 records a plurality of addresses and data corresponding to the addresses.

As the requested address, it is possible to set addresses up to a maximum number of monitor channels (CHMAX). In the illustrated example, the maximum number of monitor channels becomes 126.

The data portion has the data written from the RAM of the mother board 2 written into it corresponding to the requested address.

The address table 19 includes a table counter counting the number of addresses actually used (number of channels).

The data stored in the address table 19 becomes a fixed 4 bytes. At the RAM measurement device 14, requests are set for viewing 1 byte of data or viewing 2 bytes of data. As the configuration for increasing the speed of processing, the data is fixed to 4 bytes. The lower 2 bytes of the address are fixed to 0.

At the mother board 2, data is always sent by a fixed 4 bytes, so processing for judging to read 1 byte of data, read 2 bytes, or 4 bytes becomes unnecessary. Therefore, the speed of the processing can be increased.

The mother board 2 reads the addresses from the common memory 16, so has an address table 20 in the processing application. The address table 20 is made a mirror structure identical to the address table 19 in the common memory 16.

Figure 6:
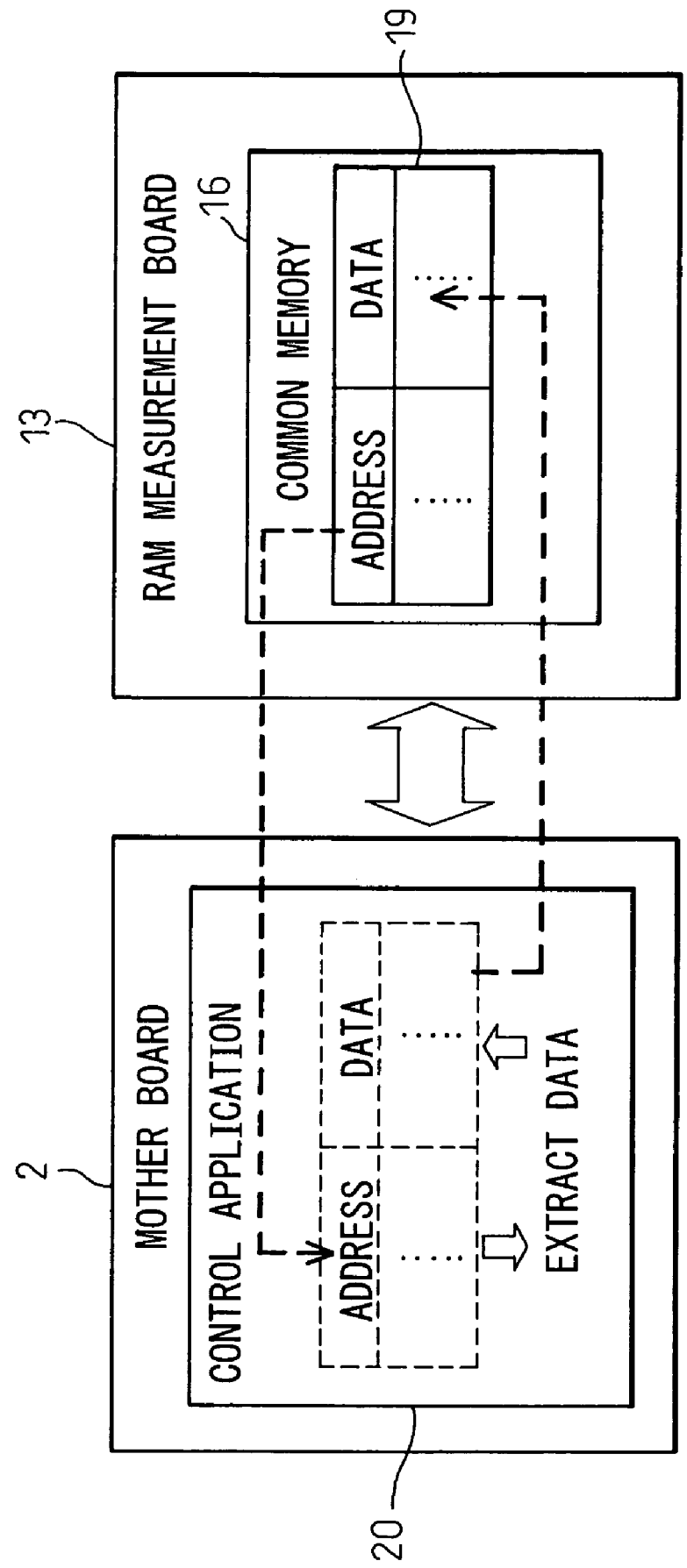
FIG. 6 is a view of the structure of tables of the mother board and common board of FIG. 1.

FIG. 6 will be used to explain the relationship between the address table 20 of the mother board 2 and the address table 19 of the RAM measurement board 13.

In the mother board 2, at the time of initialization, an address is read from the address table 19 of the common memory 16 and stored in the address table 20. At this time, the value of the table counter is also read.

In normal processing after the end of initialization, at the timing 17 of receiving the final data of the application processing, the data is extracted from the RAM corresponding to the designated address and written in the address table 20. Further, data stored in the address table 20 is sent to the common memory 16 of the RAM measurement board 13 for exactly the amount counted by the table counter.

The RAM measurement board 13 successively stores the received data in the address table 19.

In this way, in normal processing, the mother board 2 sends the RAM measurement board 13 only data and does not send addresses. Due to this, it is possible to realize higher speed processing.

Figure 7:
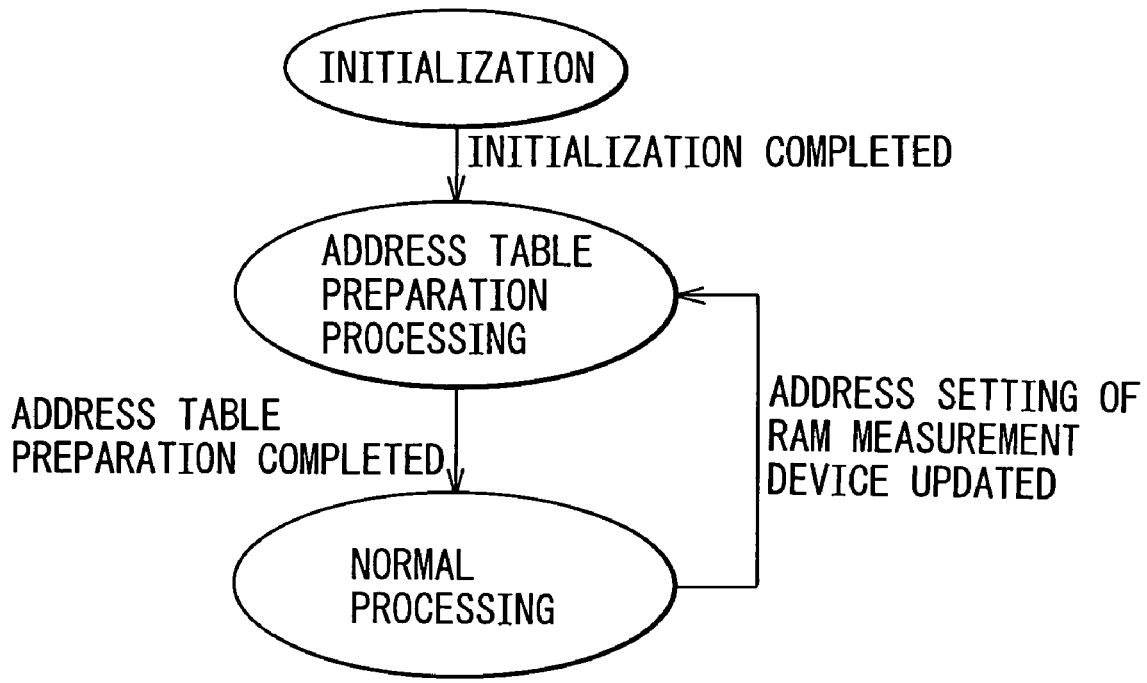
FIG. 7 is a state transition chart at the time of a RAM monitor operation in the RAM measurement board of FIG. 1.

FIG. 7 will be used to explain the processing at the time of RAM monitoring in the RAM measurement board 13.

First, the processing of FIG. 7 as a whole will be explained.

The initialization is processing for preparing the address table 19 in the common memory 16.

When the address table preparation processing ends, normal processing is shifted to.

During the normal processing, when receiving a request for change of settings from the RAM measurement device 14, the routine returns to the initialization and redoes the address table preparation processing.

Next, the details of the initialization will be explained.

A1. Hold the INIT signal from the RAM measurement board 13 to the RAM measurement device (FIG. 3) inactive. Due to this, the RAM measurement device 14 does not start the RAM monitor function until the INIT signal enters the active state.

A2. Initially output the address table update request signal A from the RAM measurement board 13 to the mother board 2 (FIG. 3).

A3. Initialize the address table 19 of the common memory 16 and set the value of the table counter to "0".

A4. Turn off the table preparation flag (not shown).

When the initialization is completed, the INIT signal to the RAM measurement device 14 is made active and the routine shifts to the address table preparation processing.

The details of the address table preparation processing will be explained next.

When receiving a monitor request from the RAM measurement device 14, the following processing is performed:

B1. Fetch the address from the received monitor request.

B2. While the table preparation flag is off, return dummy data (0) to the RAM measurement device 14. This is processing required by the RAM measurement device 14.

B3. Search the address table 19 in the range shown by the table counter. Here, if the table counter shows "0", it is judged that there is no identical address. If there is an identical address, it is judged that the setter has mistakenly set the same address, so the processing for this address is not performed. If there is no identical address, add the requested address to the address table 19 and update the table counter.

Next, whether the address table has finished being prepared is judged. Specifically, it is judged finished if either of the next conditions of C1 and C2 is satisfied.

C1. After the address table preparation processing has been started, fetch the number of addresses of the set maximum number of channels (N. CHMAX) of the RAM measurement device 14.

C2. After the address table preparation processing has been started, fetch the addresses of the maximum sampling time (T. SMPMAX) of the RAM measurement device 14.

When checking the above conditions C1 and C2 and neither of the conditions is satisfied, the processing of the above B1 to B3 is repeated to thereby prepare the address table 19.

Note that just one of the above conditions C1 and C2 can also be made the judgment condition. In the above example, however, the two conditions are employed to judge the final determination by the conditions judged faster.

When either condition of the above conditions C1 and C2 is satisfied, the processing of the following D1 to D4 is performed:

D1. Return dummy date (0) to the RAM measurement device 14.

D2. Invert the address update request signal A to the mother board 2. Due to this, the updating of the address table at the mother board 2 is confirmed.

D3. After notifying the signal A, wait for the wait time (T. WAIT) corresponding to the time for the mother board 2 to recognize the address table.

D4. Change the table preparation flag from off to on and shift the routine to normal processing. Note that while the table preparation flag is off, repeat the processing for returning dummy data (0) to the RAM measurement device 14 every predetermined period.

Details of the normal processing will be explained next.

When a monitor request is received from the RAM measurement device 14 after the address table preparation processing is finished, the processing of the following E1 and E2 is performed.

E1. Fetch the address from the received monitor request.

E2. Search through the address table of the range shown by the table counter to see whether it has the data of the fetched address.

When the same address is detected, the processing of the next F1 to F3 is performed. When the same address is not detected, it is judged that the address has been updated, so the processing of the next G1 to G3 is performed.

F1. Extract corresponding data (4-byte fixed length). Here, the data is written from the mother board 2 side.

F2. Fetch the data covered from the 4-byte fixed length data based on the lower 2-bit information of the monitor request address and data size of the request from the RAM measurement device 14. Due to this, data of the requested byte length set at the RAM measurement device 14 is taken out.

F3. Send the extracted data to the RAM measurement device 14.

G1. Initialize the address table of the RAAM measurement board 13 (table counter→0).

G2. Return the dummy data (0) to the RAM measurement device 14.

G3. Turn off the table preparation flag and shift to address table preparation processing.

Figure 8:
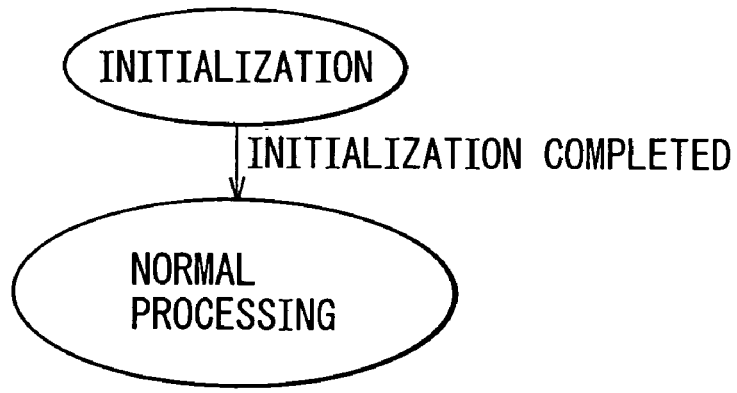
FIG. 8 is a state transition chart at the time of a RAM monitor operation in the mother board of FIG. 1.

FIG. 8 will be used to explain the RAM monitor processing in the mother board 2.

If sending the address update request signal A (FIG. 3) from the RAM measurement board 13, the initialization is started.

The initialization resets the table counter of the address table 20 of the mother board 2 to 0.

When the initialization is completed, the normal processing is shifted to. The normal processing performs the processing H1 and H2.

H1. Read the address update request signal A, compare the previous value data, and check for inversion. When inverted, perform the following J1 and J2 and when not inverted, do not perform processing.

J1. Update value of address update request signal A to currently received value.

J2. Read address table 19 from common memory 16 and copy on to internal RAM 1. At this time, read address counter value and read data of amount of size shown by count.

H2. Check the table counter and perform processing of next K1 to K3 based on check results.

K1. When the counter value is 0, do not perform processing.

K2. When the counter value is the table size or greater, the system is abnormal, so perform failsafe processing and initialize address table 19 (table counter →0).

K3. When other than K1 and K2, perform next L1 and L2.

L1. Read address of range indicated by address counter and store data in address table 20. This processing is performed when updating address table.

L2. Write data value of address table 20 of amount of size indicated by address counter in address table 19 of RAM measurement board 13. As explained above, the data size is fixed at 4 bytes.

(RAM Write Function)

For the RAM write function as well, the timing of processing by the RAM measurement board 13 is divided as shown in FIG. 3. The content of the processing is as shown in FIG. 4. This point has already been explained, so here overlapping explanations will be omitted.

In FIG. 3, at the time of a RAM write operation, the control signal A is not used. The control signals B and C and the INIT signal are used. The control signal B becomes the write request signal from the RAM measurement board 13 to the mother board 2 (hereinafter "write request signal B"), while the control signal C becomes the write completion signal from the mother board 2 to the RAM measurement board 13 (hereinafter "write completion signal C").

FIG. 9 shows the structure of the RAM write address table 21.

The address table 21 is for write use and is written with data one bit at a time, so the table becomes only one channel. Further, the content becomes the write address, data size, and write data.

Figure 10:
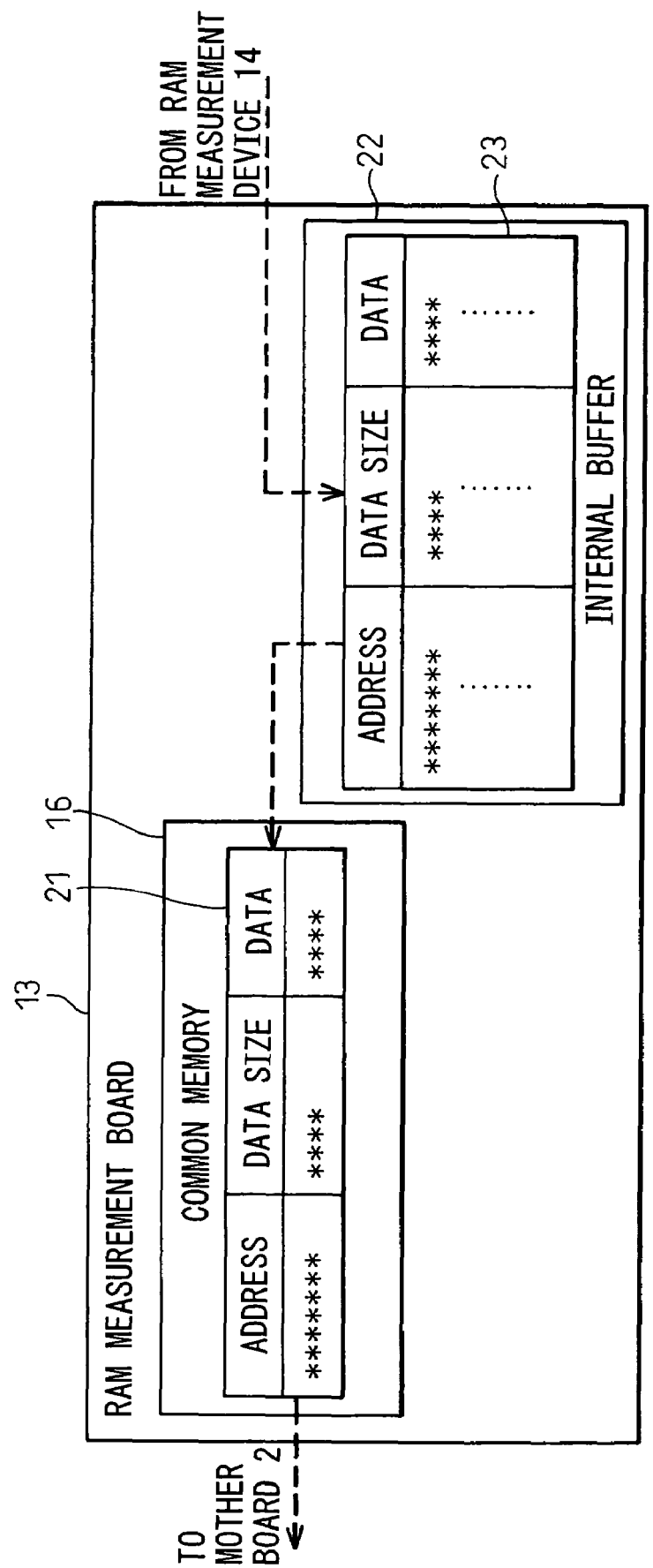
FIG. 10 is a view of the relationship between the address table of FIG. 9 and an internal buffer.

As shown in FIG. 10, the address table 21 is stored in the common memory 16. At the time of a RAM data write operation, a write request from the RAM measurement device 14 arrives before the write operation at the mother board 2 is ended. Therefore, the RAM measurement board 13 is provided with an internal buffer 22 and stores the buffer table 23. The buffer table 23 is structured similar to the address table 21, but stores a plurality of data, so has a predetermined buffer size (N. WBUF).

When a write request from the RAM measurement device 14 is received, the write content is stored in the buffer table 23. When the RAM data finishes being written at the mother board 2, a write request is issued to the mother board 2 in accordance with the address table 21 and the next data is shifted from the buffer table 23 to the address table 21.

Figure 11:
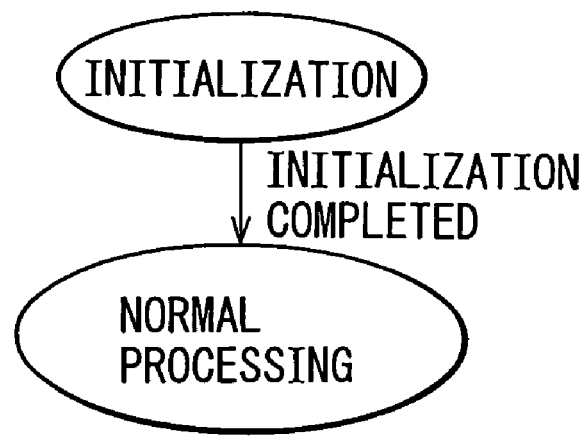
FIG. 11 is a state transition chart at the time of a RAM write operation in the RAM measurement board of FIG. 1.

FIG. 11 will be used to explain the content of processing at the time of RAM write processing in the RAM measurement board 13.

The illustrated processing is started in the RAM measurement device 14 when an operation is performed for the write processing and the signal is received.

In the initialization, the processing of the next M1 to M4 is performed.

M1. Initialize address table 21 and buffer table 23.

M2. Turn write completion flag off.

M3. Initialize value (previous value) of write completion signal C.

M4. Initially output write request signal B.

In the normal processing, the processing of the following N1 and N2 is performed.

N1. Fetch received RAM write content and add to buffer table 23.

N2. Read write completion signal C, compared previous value data, and check for inversion. If inverted, perform the following P1 to P3 while if not inverted, do not perform the processing.

P1. Update the previous value data by the write completion signal C.

P2. Set oldest data of buffer table 23 in address table 21. This is performed by the FIFO.

P3. Output the write request signal B inverted.

Further, as periodic processing (for example, every 1 ms), the following Q1 and Q2 are executed.

Q1. Search the buffer table 23 to determine if there is an unprocessed request. If there is an unprocessed request, do not perform any processing.

Q2. When there is an unprocessed request, compare the write completion signal C with the read previous value data and check for inversion. If inverted, perform the following R1 to R3 while if not inverted, do not perform the processing.

R1. Update the previous value data in accordance with the write completion signal C.

R2. Set the oldest data of the buffer table 23 in the address table 21 and delete the set data from the buffer table 23.

R3. Output the write request signal B inverted.

Figure 12:
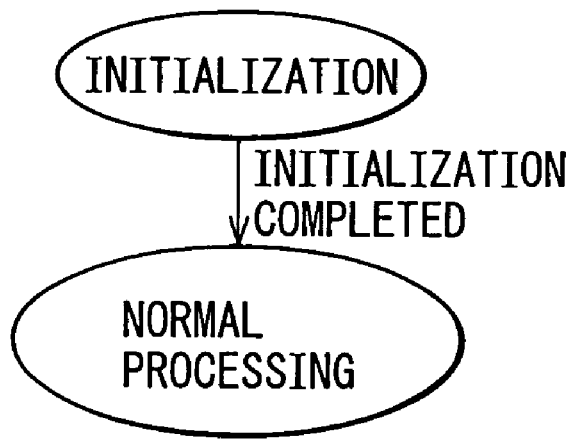
FIG. 12 is a state transition chart at the time of a RAM write operation in the mother board of FIG. 1.

FIG. 12 will be used to explain the content of processing at the time of RAM write processing in the mother board 2.

In the initialization, when receiving a write request signal B, the previous value data is initialized. Further, the write completion signal C is initially output.

When the initialization is completed, normal processing is shifted to.

In normal processing, the processing of the next S1 is performed after completion of execution of the control application.

Note that no similar mirror table as the address table 19 of the common memory 16 is provided in the mother board 2 for the write operation.

S1. Read the write request signal B, compare the previous value data, and check for inversion. If inverted, perform the processing of the next T1 to T3. If not inverted, no processing is performed.

T1. Update the previous value data by the write request signal B.

T2. Read the write content from the address table 19 of the common memory 16 and writes the data in accordance with the content.

T3. Output the write completion signal C inverted.

While the invention has been described with reference to specific embodiments chosen for purpose of illustration, it should be apparent that numerous modifications could be made thereto by those skilled in the art without departing from the basic concept and scope of the invention.

The invention claimed is:

1. A microcomputer logic development device comprising:
   a first block including a first Central Processing Unit (CPU) and a Random Access Memory (RAM) and providing functions corresponding to a microcomputer core;
   a second block including a second CPU and providing functions corresponding to microcomputer resources;
   a bus connecting said first and second blocks; and
   a RAM measurement block including a common memory, and being connected to said first block and a RAM measurement device;
   wherein a process for monitoring the RAM of said first block by the RAM measurement device is divided into a first process for writing content said RAM in said common memory and a second process for sending content of said common memory to said RAM measurement device, and said process for writing content of said RAM in said common memory and said process for sending content of said common memory to said RAM measurement device are performed in different timing; and
   wherein said first CPU performs an application processing, which is a process in a microcomputer core, upon receipt of an event from said second block, performs a data communication of I/O information with said second block while said application processing is being performed, and performs said first process at a last timing of said application processing.

2. A microcomputer logic development device as set forth in claim 1,
   wherein said RAM measurement block comprises a third CPU, said third CPU performing a process for monitoring said RAM of said first block and a process for preparing an address table, wherein said process for monitoring said RAM of said first block is performed after finally determining all addresses of a monitor request by said process for preparing the address table, and address data are not included in data of said RAM to be monitored.

3. A microcomputer logic development device as set forth in claim 2, wherein said third CPU judges said final determination by employing a condition for judgment that the addresses of a set maximum number of channels of said RAM measurement device are fetched as a condition for judgment of final determination of all addresses of a monitor request.

4. A microcomputer logic development device as set forth in claim 2, wherein said third CPU judges said determination by employing a judgment condition that the addresses of a maximum sampling time of said RAM measurement device are fetched as a condition for judgment of final determination of all addresses of a monitor request.

5. A microcomputer logic development device as set forth in claim 2, wherein said third CPU judges said final determination by employing a judgment condition that the addresses of a set maximum number of channels of said RAM measurement device are fetched, or that the addresses of a maximum sampling time of said RAM measurement device are fetched, whichever satisfies earlier.

6. A microcomputer logic development device as set forth in claim 2, wherein said third CPU eliminates any request made for a same address in said process for preparing the address table.

7. A microcomputer logic development device as set forth in claim 2, wherein said third CPU shifts from said processing for monitoring said RAM of said first block to said processing for preparing the address table when receiving an address request not in said address table from said RAM measurement device.

8. A microcomputer logic development device as set forth in claim 2, wherein said third CPU outputs a control signal to said first block when the content of said address table is updated and said first CPU reads said address table in accordance with the received control signal.

9. A microcomputer logic development device as set forth in claim 2, wherein said RAM measurement block forms a write table in said common memory and an internal buffer and stores content of a write request in said internal buffer before storing it in said common memory when receiving a write request from said RAM measurement device.

10. A microcomputer logic development device as set forth in claim 9, wherein said third CPU writes the content of said internal buffer in said common memory when judging that a write operation has been completed based on a write completion signal from said first block.

11. A microcomputer logic development device as set forth in claim 9, wherein said third CPU judges if a write operation has been completed, based on a write completion signal from said first block, at periodic timings and when receiving a write request from said RAM measurement device.

12. A microcomputer logic development device as set forth in claim 2, wherein said first CPU checks a write request signal from said RAM measurement block right after completion of control software processing in said first block.

\* \* \* \* \*